United States Patent
Patti (10) Patent No.: US 11,843,369 B2
(45) Date of Patent: Dec. 12, 2023

(54) INTEGRATED MOS TRANSISTOR WITH SELECTIVE DISABLING OF CELLS THEREOF

(71) Applicant: STMicroelectronics S.r.l., Agrate Brianza (IT)

(72) Inventor: Davide Giuseppe Patti, Mascalucia (IT)

(73) Assignee: STMicroelectronics S.r.l., Agrate Brianza (IT)

(*) Notice: Subject to any disclaimer, the term of this patent is extended or adjusted under 35 U.S.C. 154(b) by 221 days.

(21) Appl. No.: 17/388,920

(22) Filed: Jul. 29, 2021

(65) Prior Publication Data

US 2022/0038094 A1 Feb. 3, 2022

(30) Foreign Application Priority Data

Jul. 31, 2020 (IT) .................. 102020000018733

(51) Int. Cl.
*H01L 27/06* (2006.01)
*H01L 29/06* (2006.01)
*H01L 29/66* (2006.01)
*H01L 29/78* (2006.01)
*H03K 17/30* (2006.01)

(52) U.S. Cl.
CPC ....... *H03K 17/302* (2013.01); *H01L 27/0629* (2013.01); *H01L 29/0696* (2013.01); *H01L 29/66734* (2013.01); *H01L 29/7808* (2013.01); *H01L 29/7813* (2013.01)

(58) Field of Classification Search
CPC ............ H01L 27/0629; H01L 29/0696; H01L 29/66734; H01L 29/7808; H01L 29/7813; H03K 17/302
USPC ........................................................ 257/204
See application file for complete search history.

(56) References Cited

U.S. PATENT DOCUMENTS

| | | | |
|---|---|---|---|
| 2012/0049270 A1* | 3/2012 | Hirler | H01L 29/7808 438/237 |
| 2012/0326207 A1 | 12/2012 | Yoshimochi | |
| 2015/0349091 A1 | 12/2015 | Yilmaz et al. | |
| 2016/0191048 A1 | 6/2016 | Lui et al. | |

FOREIGN PATENT DOCUMENTS

WO 02/41404 A2 5/2002

* cited by examiner

*Primary Examiner* — Igwe U Anya
(74) *Attorney, Agent, or Firm* — SEED INTELLECTUAL PROPERTY LAW GROUP LLP (57) ABSTRACT

An integrated device includes at least one MOS transistor having a plurality of cells. In each of one or more of the cells a disabling structure is provided. The disabling structure is configured to be in a non-conductive condition when the MOS transistor is switched on in response to a control voltage comprised between a threshold voltage of the MOS transistor and an intervention voltage of the disabling structure, or to be in a conductive condition otherwise. A system comprising at least one integrated device as above is also proposed. Moreover, a corresponding process for manufacturing this integrated device is proposed.

20 Claims, 9 Drawing Sheets

INTEGRATED MOS TRANSISTOR WITH SELECTIVE DISABLING OF CELLS THEREOF

BACKGROUND

Technical Field

The present disclosure relates to the field of integrated devices. More specifically, this disclosure relates to MOS transistors.

Description of the Related Art

The background of the present disclosure is hereinafter introduced with the discussion of techniques relating to its context. However, even when this discussion refers to documents, acts, artifacts and the like, it does not suggest or represent that the discussed techniques are part of the prior art or are common general knowledge in the field relevant to the present disclosure.

Integrated devices based on MOS transistors are commonly used in several applications. Particularly, the MOS transistors are among the most common components in power applications, wherein substantial amounts of electrical energy are processed; in this case, the MOS transistors are designed to operate at relatively high voltages and/or currents. The (power) MOS transistors generally have a cellular structure. Particularly, each MOS transistor replicates a same structure throughout several cells. The cells comprise corresponding (basic) gate regions and source regions that are connected in parallel, for example, in the form of alternated strips. The cellular structure provides a high ratio perimeter/area of the source regions. This allows obtaining a relatively wide channel (thereby increasing the current that may be sustained) in a relatively small area of a die whereon the MOS transistor is integrated (thereby reducing a size of the corresponding integrated device).

Performance of the MOS transistors are defined by several characteristics thereof. Particularly, a very important characteristic of the MOS transistors is their Safe Operating Area (SOA). The SOA of each MOS transistor is defined by the drain/source voltage Vds and drain/source current (Ids) that the MOS transistor is expected to sustain without self-damaging (with the MOS transistor that should never be exposed to operating conditions outside its SOA, even for an instant).

Several factors limit the SOA of the MOS transistors. Particularly, in a diagram plotting the drain/source voltage Vds and the drain/source current Ids in logarithmic scale, the SOA is delimited by edge segments that are substantially straight. These edge segments are defined (in succession for increasing values of the drain/source voltage Vds) by a drain/source on-state, or output, resistance RDSon limitation (affecting the MOS transistor operating in the linear or ohmic region wherein the drain/source voltage Vds is substantially proportional to the drain/source current Ids), a drain/source current Ids limitation (determined by its maximum value), a thermal limitation (determined by a maximum heat dissipation), a secondary breakdown limitation (determined by a thermal runaway affecting the MOS transistor when operating in a linear mode wherein the drain/source current Ids is proportional to small changes of its gate/source voltage Vgs) and a drain/source voltage Vds limitation (determined by its maximum value).

A technique for enlarging the SOA of a MOS transistor (with a cellular structure) provides for removing the source regions is some of the cells (such as one every two of them). In this way, resulting dummy regions of the die wherein the source regions are removed are inactive during operation of the MOS transistor, and then do not generate heat. Moreover, the dummy regions act as a heat sink for the rest of the MOS transistor. Therefore, the heat that is generated by the MOS transistor (around the remaining source regions) is dissipated in part by the dummy regions, thereby limiting the heating of the MOS transistor.

However, the dummy regions reduce the number of the source regions of the MOS transistor, and then increase its drain/source on-state resistance RDSon accordingly. Indeed, the drain/source on-state resistance RDSon is given by several contributions along a path of the drain/source current Ids from a drain terminal to a source terminal of the MOS transistor; particularly, these contributions comprise a resistance of the source regions. Since the source regions are connected in parallel, the lower the number of source regions the higher their total resistance.

The increase of the drain/source on-state resistance RDSon accordingly increases the corresponding limitation in the SOA of the MOS transistor. Therefore, this adversely affects the performance of the MOS transistor, especially when it operates in the linear region.

BRIEF SUMMARY

A simplified summary of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

In general terms, the present disclosure is based on the idea of disabling the cells selectively.

Particularly, an aspect provides an integrated device comprising at least one MOS transistor having a plurality of cells. In each of one or more cells a disabling structure is provided; the disabling structure is configured to be in a non-conductive condition when the MOS transistor is switched on in response to a control voltage comprised between a threshold voltage of the MOS transistor and an intervention voltage of the disabling structure, or to be in a conductive condition otherwise.

A further aspect provides a system comprising at least one integrated device as above.

A further aspect provides a corresponding process for manufacturing this integrated device.

BRIEF DESCRIPTION OF THE SEVERAL VIEWS OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes, like value, content and representation). In this respect, it is expressly intended that the drawings are not necessary drawn to scale (with some details that may be exaggerated and/or simplified) and that, unless otherwise indicated, they are merely used to illustrate the structures and procedures described herein conceptually. Particularly:

FIG. 3A-FIG. 3K show the main steps of a manufacturing process of the integrated device according to an embodiment of the present disclosure, and FIG. 4 shown a schematic block diagram of a system incorporating the integrated device according to an embodiment of the present disclosure.

DETAILED DESCRIPTION

Figure 1:
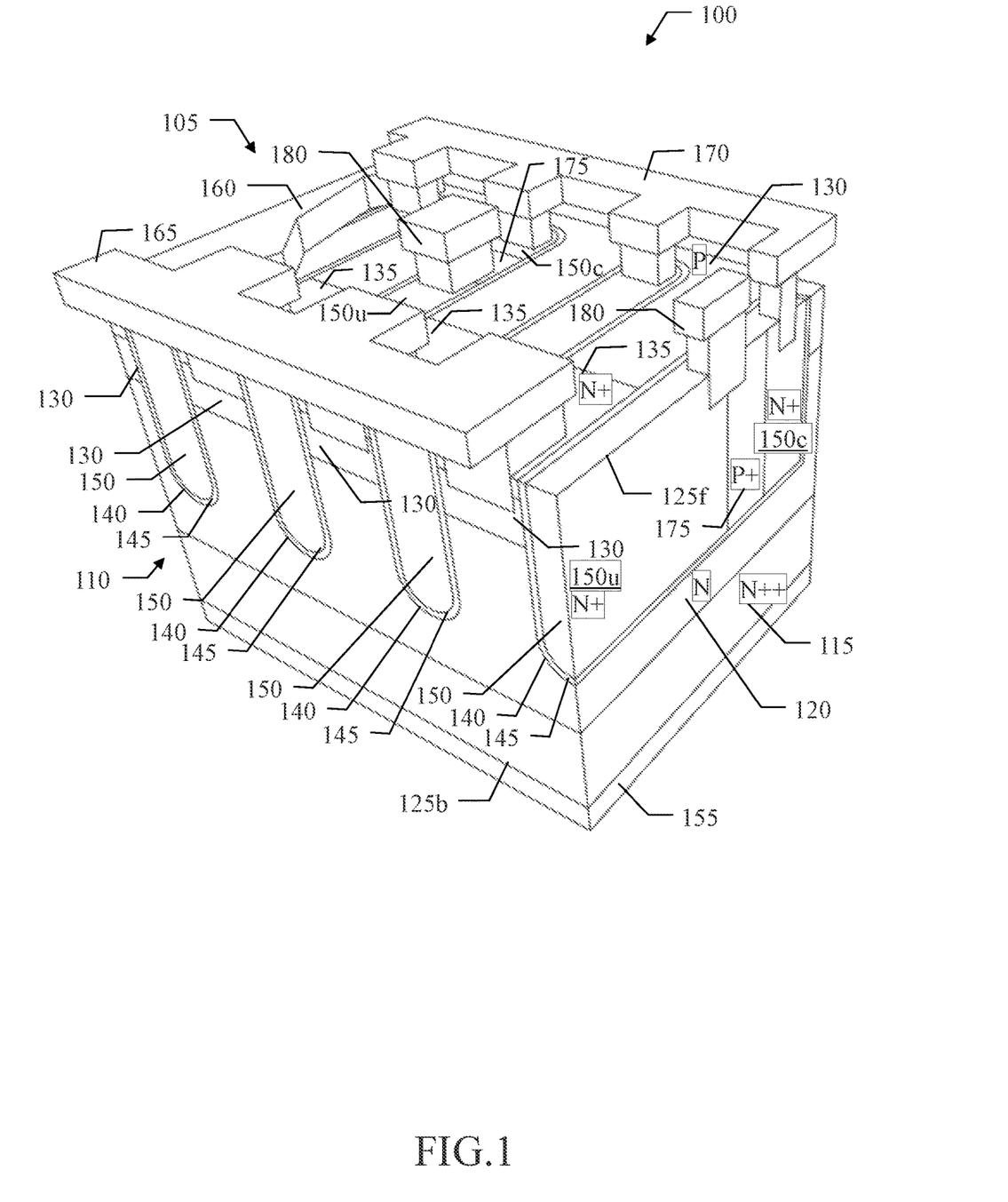
FIG. 1 shows a partial pictorial representation in cross-section view of an integrated device according to an embodiment of the present disclosure.

With reference in particular to FIG. 1, a partial pictorial representation is shown in cross-section view of an integrated device 100 according to an embodiment of the present disclosure.

The integrated device 100 comprises a MOS transistor 105 (or more). The MOS transistor 105 is of Double diffusion type (DMOS) and it has a vertical structure based on trench gates, such as with a U-shape (UMOS). The MOS transistor 105 implements a power component, which is designed to handle relatively high electric power (for example, of the order of more than 10 W), such as operating at corresponding relatively high currents and/or voltages (for example, of the order of more than 10 A and 10 V, respectively).

The MOS transistor 105 is integrated on a semiconductor bulk, such as a die 110 of semiconductor material, for example, silicon (so as to define a corresponding chip). As usual, the concentrations of N-type and P-type dopants (or impurities) of the semiconductor material are denoted by adding the sign + or the sign − to the letters N and P to indicate a high or low concentration of impurities, respectively, or the sign ++ or the sign −− to indicate a very high or a very low concentration of impurities, respectively; the letters N and P without the addition of any sign + or − denote concentrations of intermediate value. The die 110 comprises a substrate 115 of N++ type (far thicker in reality), over which a (thin) epitaxial layer 120 of N type is arranged. A free main surface of the epitaxial layer 120 defines a front surface 125$f$ of the die 110, whereas a free main surface of the substrate 115 defines a back surface 125$b$ of the die 110 (opposite to each other).

The MOS transistor 105 comprises the following components. A drain region of N++ type is defined by the substrate 115 (extending into the die 110 from the back surface 125$b$). A body region 130 of P type extends into the epitaxial layer 120 of the die 110 from the front surface 125$f$, so as to remain separate from the drain region 115. The MOS transistor 105 has a cellular structure, with a same structure replicated throughout a plurality of cells (such as 100-1.000). Particularly, each cell comprises the following components. A source region 135 of N+ type extends into the body region 130 from the front surface 125$f$. A gate trench 140 extends into the body region 130 and then into the epitaxial layer 120 of the die 110 from the front surface 125$f$. The gate trench 140 is coated with a (relatively thin) gate insulating layer 145 of (electrical) insulating material (for example, silicon oxide). The (coated) gate trench 140 is filled with a gate element 150 of (electrical) conductive material, such as doped polysilicon of N+ type. The MOS transistor has an interdigitated architecture; particularly, in plant view (on the front surface 125$f$) the source regions 135 and the gate elements 150 have an elongated shape (strips) and are arranged parallel, alternated to each other (like fingers of crossed hands). A drain contact 155 of (electrically) conductive material (for example, metal) contacts the drain region 115 on the back surface 125$b$. A protective layer 160 of (electrically) insulating material (for example, silicon dioxide) covers the front surface 125$f$ (partially cut away in the figure for the sake of clarity). A source contact 165 of (electrically) conductive material (for example, metal) contacts all the source regions 135 and the body region 130 through the protective layer 160. A gate contact 170 of (electrically) conductive material (for example, metal) contacts all the source regions 135 through the protective layer 160.

As usual, the MOS transistor 105 may operate in three different regions of its characteristic according to the voltages at its terminals (defined by the drain contact 155, the source contact 165 and the gate contact 170). Particularly, in a cutoff or subthreshold region a (control) gate/source voltage Vgs is lower than a threshold voltage Vth of the MOS transistor 105 (for example, 1-2 V); in this condition, the MOS transistor 105 is switched off (with no drain/source current Ids flowing through it). In a linear or ohmic region the gate/source voltage Vgs is higher than the threshold voltage Vth and a drain/source voltage Vds is strictly lower than an overdrive voltage Vov=Vgs−Vth (Vds<Vgs−Vth); in this condition, the MOS transistor 105 is switched on and the drain/source voltage Vds is substantially proportional to the drain/source current Ids. In a saturation or active region the gate/source voltage Vgs is again higher than the threshold voltage Vth but the drain/source voltage Vds is higher than the overdrive voltage (Vds≥Vgs−Vth); in this condition, the MOS transistor 105 is again switched on but now the drain/source current Ids is substantially constant (independently of the drain/source voltage Vds).

In the solution according to an embodiment of the present disclosure, as described in detail in the following, one or more selected cells further comprise corresponding disabling structures that are capable of disabling them selectively. Particularly, each disabling structure is interposed between a portion of the gate element 150 coupled with the gate contact 170 and another portion of the gate element 150 uncoupled from the gate contact 170. The disabling structure has an intervention voltage that is higher than the threshold voltage Vth (for example, equal to 1.5-3 times). The disabling structure is configured to be in a non-conductive condition when the MOS transistor is switched on in response to the gate/source voltage Vgs comprised between the threshold voltage Vth and the intervention voltage, and to be in a conductive condition otherwise.

Therefore, when the gate/source voltage Vgs is slightly higher than the threshold voltage Vth, the disabling structures are in the non-conductive condition; typically, this happens when the MOS transistor 105 operates in the saturation region (since Vgs≤Vth+Vds). In this condition, a null voltage is applied between the corresponding (selected) gate elements 150 and source regions 135. The selected cells are then inactive and do not generate heat, further acting as a heat sink for the rest of the MOS transistor 105. Therefore, the heat that is generated by the MOS transistor (around the source regions 135 of the other cells) is dissipated in part by the selected cells, thereby limiting the heating of the MOS transistor 105.

Conversely, when the gate/source voltage Vgs is far higher than the threshold voltage Vth the disabling structures are in the conductive condition; typically, this happens when the MOS transistor 105 operates in the linear region (since Vgs>Vth+Vds). In this condition, the disabling structures are substantially opaque to the operation of the MOS transistor 105; particularly, all the cells are active with all the source regions 135 contributing to the drain/source on-state resistance RDSon, which then is not adversely affected.

In the end, when the gate/source voltage Vgs is lower than the threshold voltage Vth, the disabling structures are again in the conductive condition; this happens when the MOS transistor 105 operates in the cutoff region. In this condition as well, the disabling structures are substantially opaque to the operation of the MOS transistor 105.

Therefore, the above-described solution allows disabling the selected cells selectively in a dynamic way, according to the current operating condition of the MOS transistor. Particularly, the selected cells are inactive when the MOS transistor operates at relatively high drain/source voltage Vds (as typical of the saturation region). In this condition, it is advantageous to limit the heating of the MOS transistor (since it mainly affects the corresponding portion of the SOA); in this condition, the resulting increase of the drain/source on-state resistance RDSon is substantially irrelevant (since the drain/source current Ids is practically constant). Conversely, all the cells are active when the MOS transistor operates at relatively low drain/source voltage Vds (as typical of the linear region, down to none in the cutoff region). In this condition, it is advantageous to maintain the drain/source on-state resistance RDSon low (since it mainly affects the corresponding portion of the SOA); in this condition, the missing limitation of the heating is substantially irrelevant (since the MOS transistor generates a relatively low amount of heat).

Particularly, in the specific embodiment shown in the figure, the gate element 150 of each selected cell comprises the following additional components. A separation region 175 of P+ type (for example, of doped polysilicon as well) extends into the gate element 150 from the front surface 125$f$ down to reach the insulating layer 145; in plant view (on the front surface 125$f$) the separation region 175 completely crosses the gate element 150 transversally (close to the gate contact 170). As a result, the separation region 175 separates the gate element 150 into two portions, denoted as (coupled) gate portion 150$c$ and (uncoupled) gate portion 150$u$. The gate portion 150$c$ is proximal to the gate contact 170, so as to be still coupled with it; the gate portion 150$u$ is distal from the gate contact 170 and then uncoupled therefrom (and particularly in an area of the die 110 wherein the channel of the MOs transistor 105 forms in operation). Corresponding PN junctions are then created between the separation region 175 and the gate portions 150$c$ and between the separation region 175 and the gate portions 150$u$. A bridge contact 180 of (electrically) conductive material (for example, metal) contacts both the separation region 175 and the gate portion 150$u$ (with the bridge contact 180 that is left floating).

Figure 2:
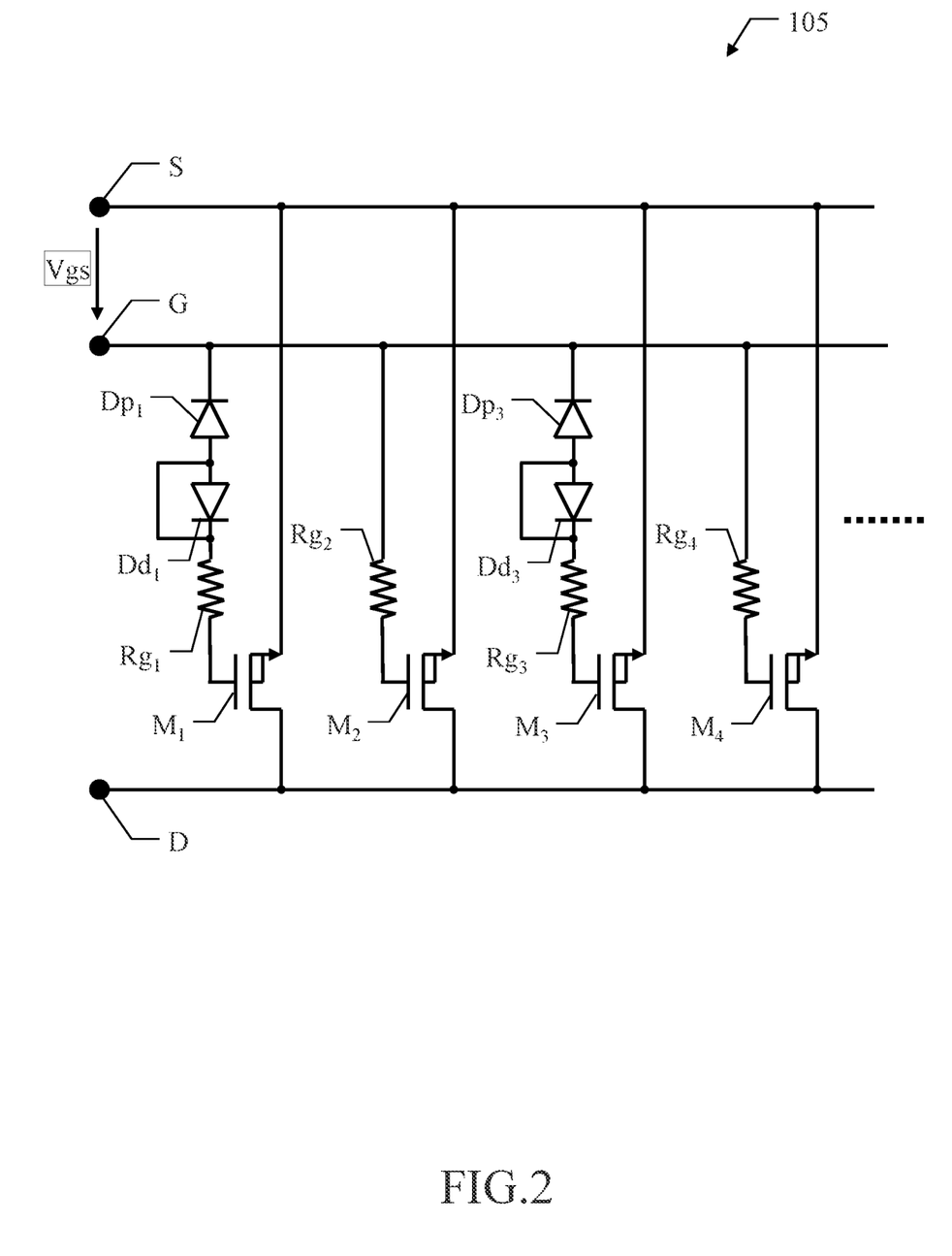
FIG. 2 shows an equivalent circuit of a MOS transistor according to an embodiment of the present disclosure.

With reference now to FIG. 2 together with FIG. 1, an equivalent circuit is shown of the MOS transistor 105 according to an embodiment of the present disclosure.

The MOS transistor 105 comprises a plurality of basic MOS transistors $M_i$ defined by its cells, with i=1 ... N where N is the number of the cells (four shown in the figure). Particularly, each basic MOS transistor $M_i$ has a drain (formed by a corresponding portion of the drain region 115), a source (formed by the corresponding source region 135) and a gate (formed by the corresponding gate element 150), with a body (formed by a corresponding portion of the body region 130) that is short-circuit to the source (via the source contact 165). A gate resistor $Rg_i$ connected to the gate of each basic MOS transistor $M_i$ represents a resistance of the gate element 150 between the gate contact 170 and the area of the die 110 wherein the channel of the MOs transistor 105 forms in operation.

In the solution according to an embodiment of the present disclosure, in the basic MOS transistor $M_s$ of each selected cell, with s=1,3 in the example at issue, a diode $Dd_s$ (formed by the PN junction between the separation region 175 and the gate portion 150$u$) and a diode $Dp_s$ (formed by the PN junction between the separation region 175 and the gate portion 150$c$) are connected in anti-series to the gate resistor $Rg_s$; particularly, the anode of the diode $Dd_s$ is connected to the anode of the diode $Dp_s$ (common separation region 175), and the cathode of the diode $Dd_s$ is connected to the gate resistor $Rg_s$ (gate portion 150$u$ mainly contributing thereto). Moreover, the diode $Dd_s$ has its anode and cathode that are short-circuited (via the bridge contact 180). The diode $Dp_s$ has a (reverse) breakdown voltage Vbk (defined by the minimum voltage that makes the diode $Dp_s$ conduct appreciably when reverse biased) strictly higher than the threshold voltage Vth (for example, 2-4 V), which breakdown voltage Vbk defines the intervention voltage of the disabling structure.

The basic MOS transistors $M_i$ are connected substantially in parallel (apart from the diodes $Dd_s,Dp_s$ where present) to form the whole MOS transistor 105. Particularly, the MOS transistor 105 has a drain terminal D (formed by the drain contact 155), a source terminal S (formed by the source contact 165) and a gate terminal G (formed by the gate contact 170). The drain terminal D is connected to the drains of all the basic MOS transistors $M_i$ (drain region 115). The source terminal S is connected to the sources of all the basic MOS transistors $M_i$ (corresponding source regions 135). The gate terminal G is coupled with the gates of all the basic MOS transistors $M_i$ (corresponding gate elements 150). Particularly, in the basic MOS transistor $M_i$ of each unselected cell, with u=2,4 in the example at issue, the gate terminal G is connected to the gate via the gate resistor $Rg_u$; in the basic MOS transistor $M_s$ of each selected cell, instead, the gate terminal G is connected to the cathode of the diode $Dp_s$ (gate portion 150$c$, neglecting its resistance), and then to the gate through the diode $Dp_s$ and the gate resistor $Rg_s$ (being the diode $Dd_s$ short-circuited).

When the gate/source voltage Vgs is higher than the threshold voltage Vth but lower than the breakdown voltage Vbk (as typical of the saturation region), the diodes $Dp_s$ are reverse biased and then non-conducting. Therefore, only the basic MOS transistors $M_u$ receive the gate/source voltage Vgs and then are switched on, whereas the basic MOS transistors $M_s$ have their gates floating and then are switched off.

Conversely, when the gate/source voltage Vgs is higher than the breakdown voltage Vbk (as typical of the linear region), the diodes $Dp_s$ become (reverse) conductive because of their electrical breakdown. Therefore, all the basic MOS transistors $M_u,M_s$ receive the gate/source voltage Vgs and then are switched on.

In the end, when the gate/source voltage Vgs is lower than the threshold voltage Vth (cutoff region), the diodes $Dp_s$ are forward biased and then conductive. Therefore, all the basic MOS transistors $M_u,M_s$ receive the gate/source voltage Vgs and then are switched off.

The above-described implementation is very simple, but at the same time effective. Moreover, it allows obtaining the desired result with a limited impact on the structure of the MOS transistor 105.

With reference now to FIG. 3A-FIG. 3K, the main steps are shown of a manufacturing process of the integrated device according to an embodiment of the present disclosure.

Figure 3A:
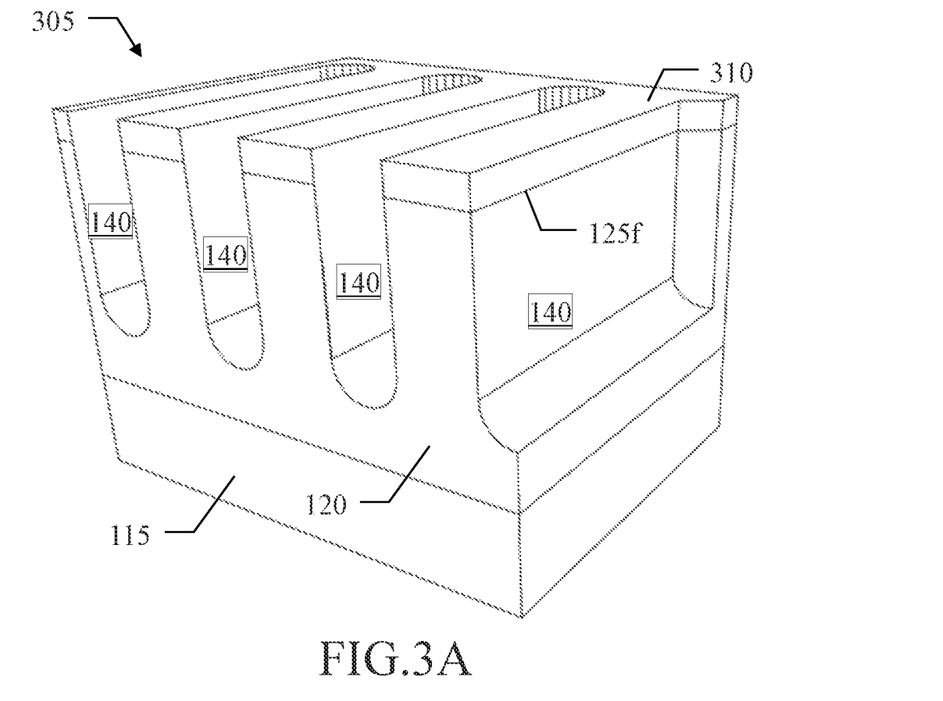

Starting from FIG. 3A, as usual the manufacturing process is performed at the level of a wafer 305 of semiconductor material, whereon the same structure is integrated simultaneously in a large number of identical areas thereof (only one referred to in the following for the sake of simplicity). The wafer 305 comprises a substrate of N++ type, which will form the substrate of the integrated devices and then is denoted with the same reference 115. An epitaxial layer of N type, which will form the epitaxial layer of the integrated devices and then is denoted with the same reference 120, is grown thermally onto the substrate 115. A mask 310 for the gate trenches is formed onto a free main surface of the epitaxial layer 120, which will form the front surface of the integrated devices and then is denoted with the same reference 125f; for example, the mask 310 is obtained by growing a (relatively thick) layer of silicon oxide with a thermal oxidation step and then etching it through a photo-resist layer suitably patterned with photo-lithographic techniques (then stripped). The wafer 305 is etched through the mask 310 (for example, with a dry etching step) to form the gate trenches 140.

Figure 3B:
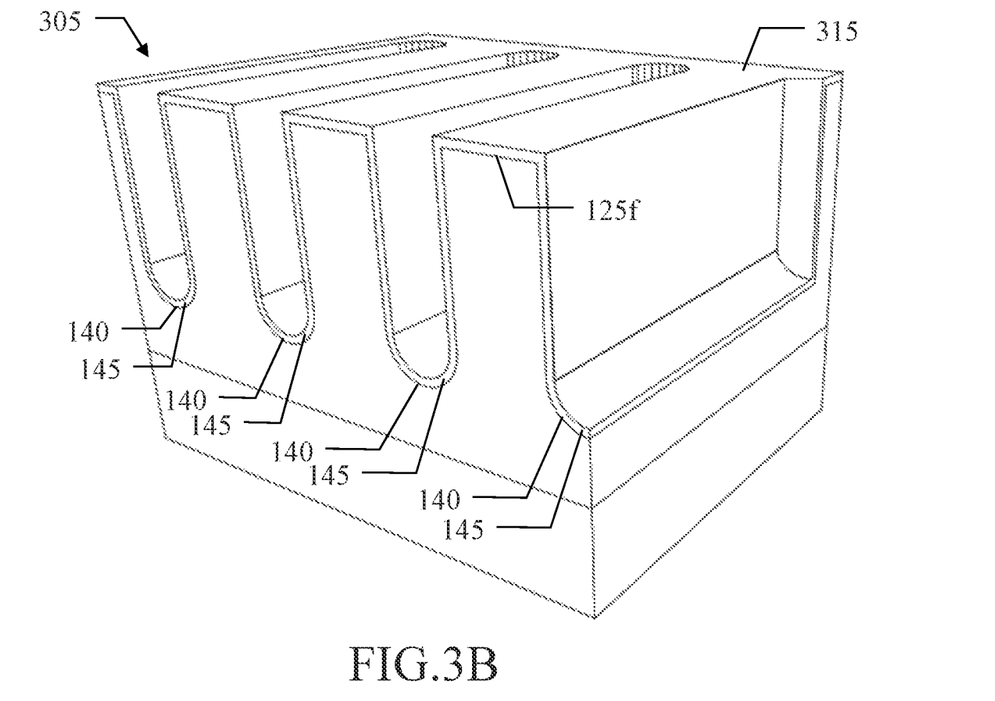

Moving to FIG. 3B, the (oxide) mask is removed. A (relatively thin) layer of silicon oxide 315 is grown with a thermal oxidation step onto the wafer 305, i.e., the front surface 125f and an exposed surface of the gate trenches 140; particularly, the portion of the layer of silicon oxide 315 coating the gate trenches 140 defines their gate insulating layers 145.

Figure 3C:
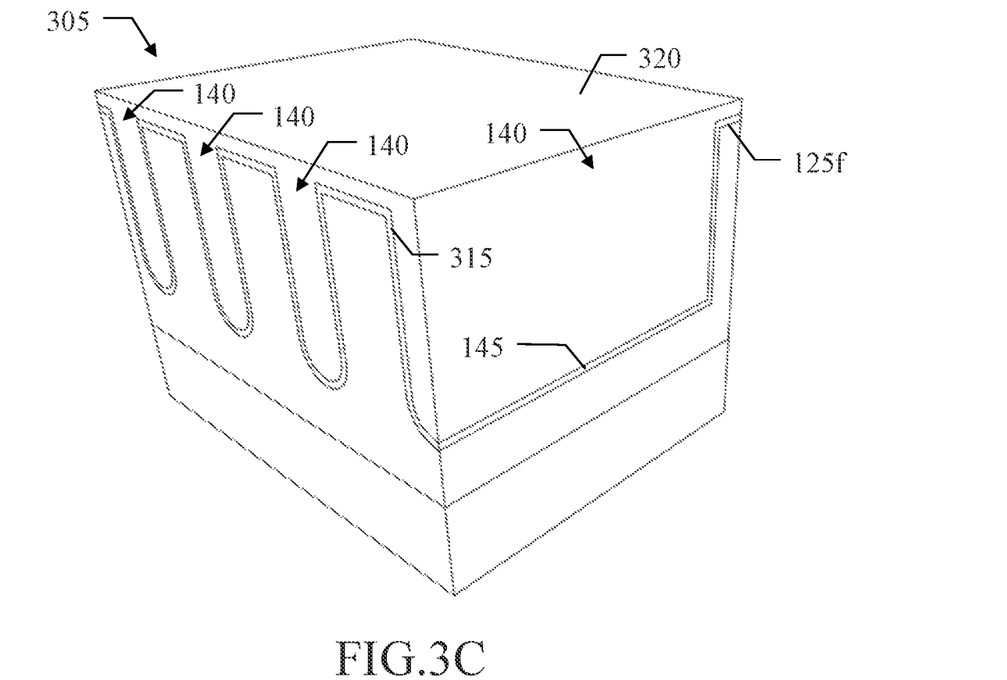

Moving to FIG. 3C, a layer of doped polysilicon 320 of N+ type is deposited onto the wafer 305, i.e., the layer of silicon oxide 315, so as to fill the (coated) gate trenches 140 and to cover the (coated) front surface 125f.

Figure 3D:
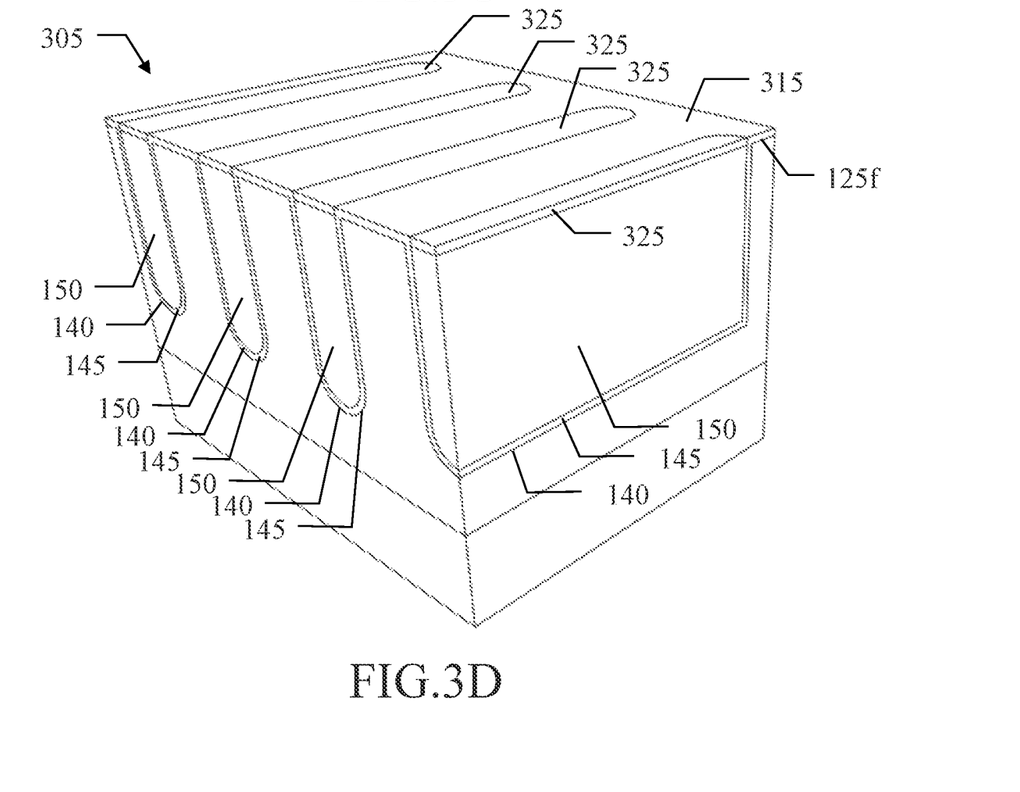

Moving to FIG. 3D, the wafer 305 is planarized (for example, with a Chemical Mechanical Polishing, CMP, step) to remove an excess of the layer of doped polysilicon from the layer of silicon oxide 315 on the front surface 125f. The operation leaves the gate trenches 140 (coated with gate insulating layers 145) filled with the (remaining) doped polysilicon, over which corresponding (thin) layers of silicon oxide 325 form, so as to obtain the gate elements 150.

Figure 3E:
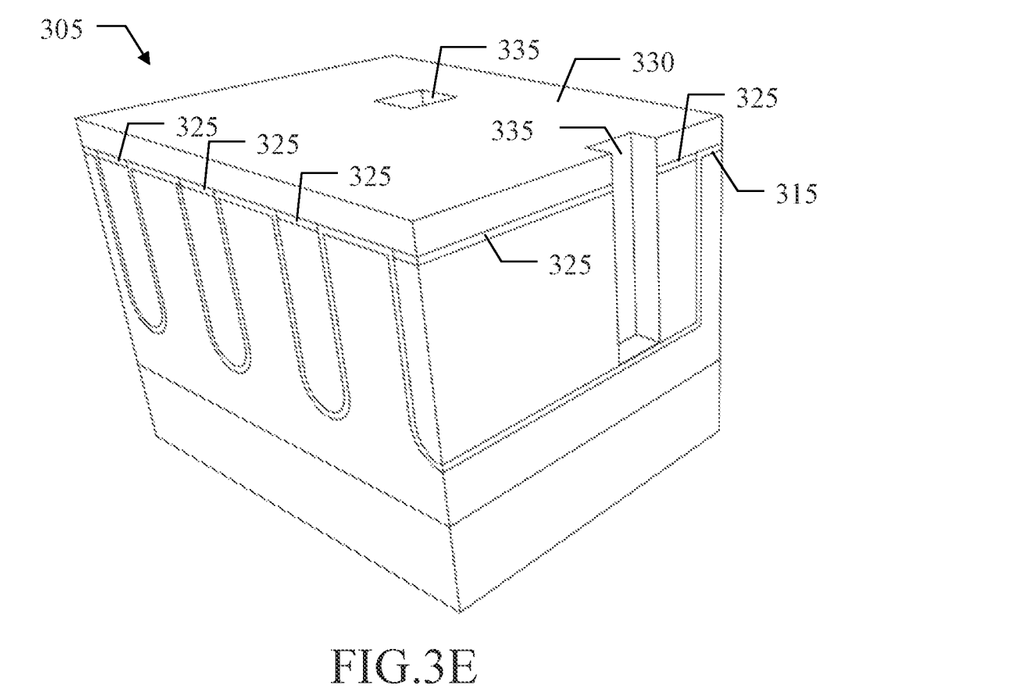

Moving to FIG. 3E, in the solution according to an embodiment of the present disclosure a mask 330 for the separation regions is formed onto the wafer 305, i.e., the layer of silicon oxides 315,325; for example, the mask 330 is obtained by depositing a layer of photo-resist material and then patterning it with photo-lithographic techniques. The wafer 305 is etched through the mask 330 (for example, with a dry etching step) to form separation trenches 335 corresponding to the separation regions.

Figure 3F:
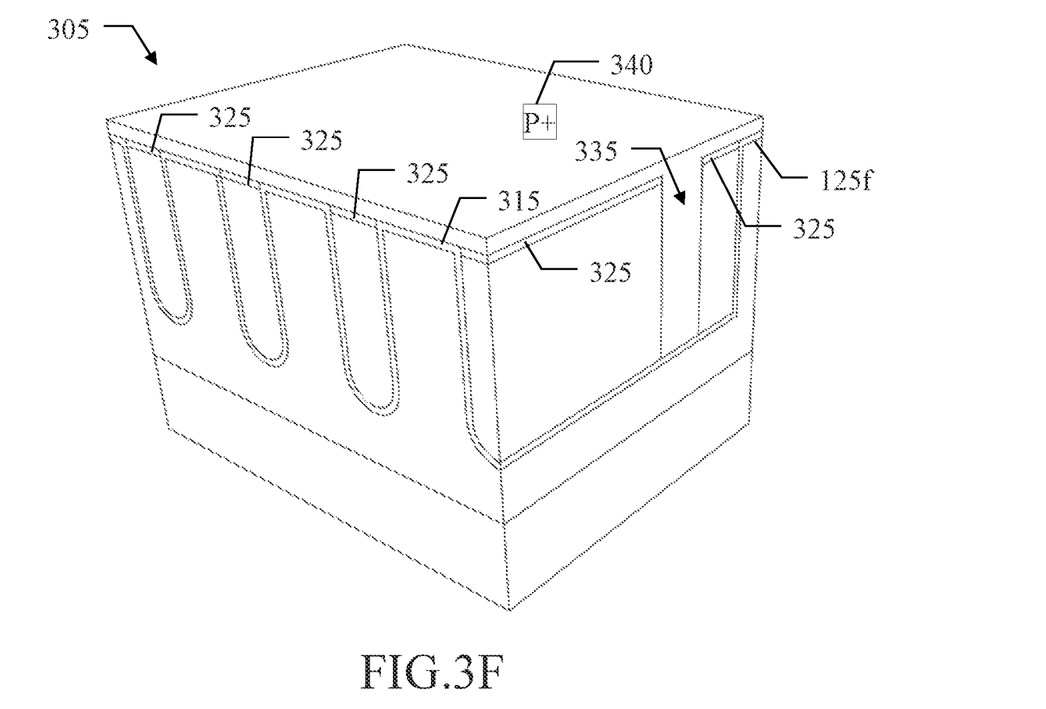

Moving to FIG. 3F, the (photo-resist) mask is stripped. A layer of doped polysilicon 340 of P+ type is deposited onto the wafer 305, i.e., the layer of silicon oxides 315,325, so as to fill the separation trenches 335 and to cover the (coated) front surface 125f.

Figure 3G:
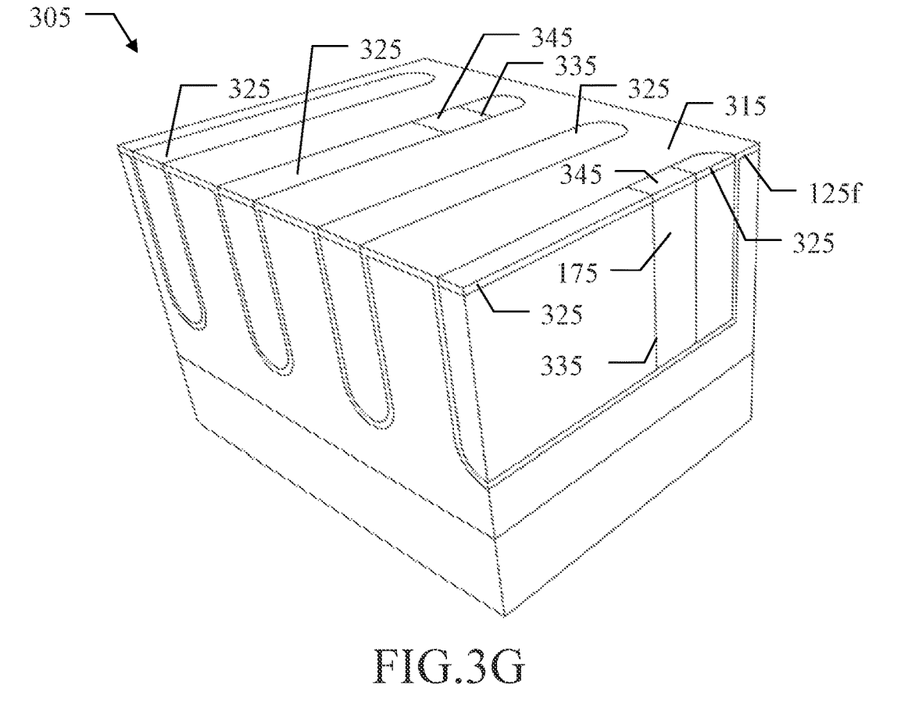

Moving to FIG. 3G, the wafer 305 is planarized (for example, with a CMP step) to remove an excess of the doped polysilicon from the layers of silicon oxide 315,325 on the front surface 125f. The operation leaves the separation trenches 335 filled with the (remaining) doped polysilicon, over which corresponding (thin) layers of silicon oxide 345 form, so as to obtain the separation regions 175.

Figure 3H:
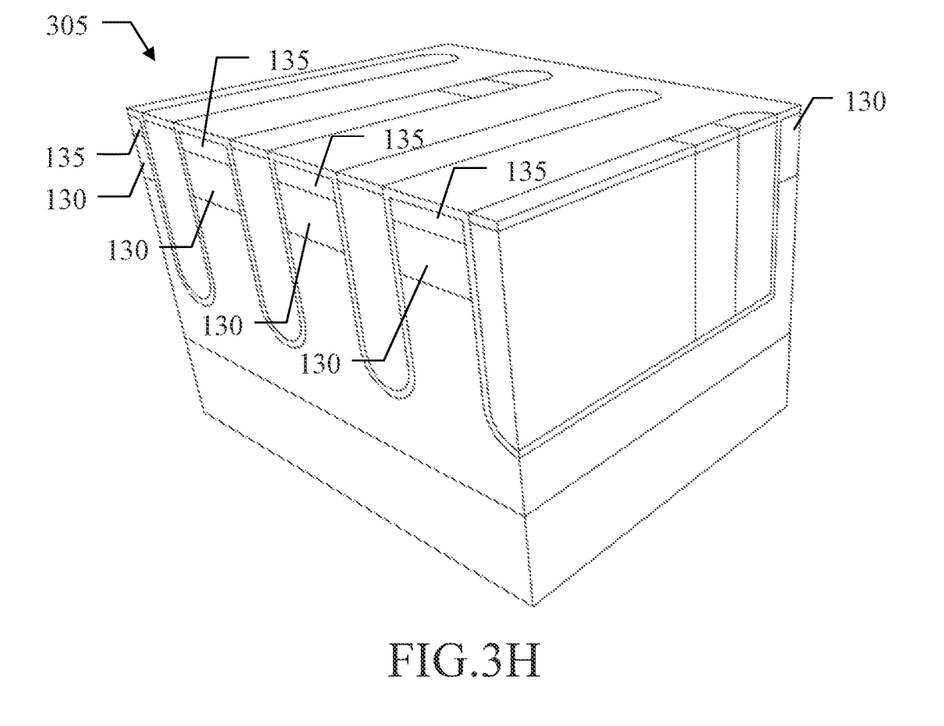

Moving to FIG. 3H, the body region 130 of P type and the source regions 135 of N+ type are formed as usual. For example, not shown in the figure, the body region 130 is formed with a ionic implantation step through a photo-resist mask (then stripped), followed by a thermal diffusion step; likewise, the source regions 135 are formed with a ionic implantation step through another photo-resist mask (then stripped), followed by a thermal diffusion step.

Figure 3I:
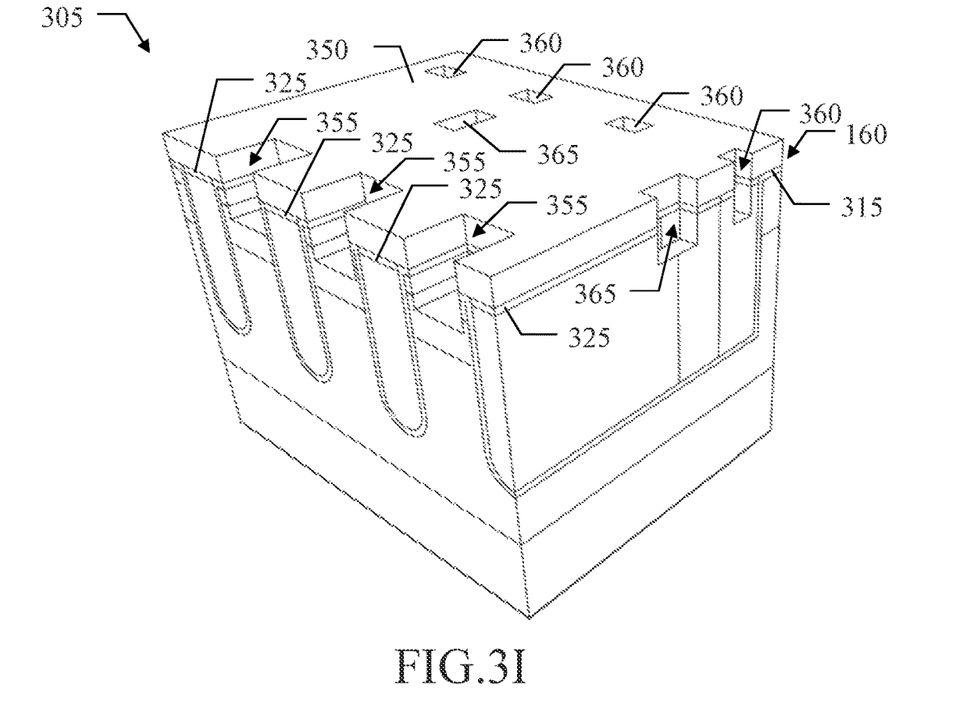

Moving to FIG. 3I, a (relatively thick) layer of silicon oxide 350 is grown with a thermal oxidation step onto the wafer 305, i.e., the layers of silicon oxide 315,325 (together defining the protective layer 160). Source windows 355 for the source contact, gate windows 360 for the gate contact and bridge windows 365 for the bridge contacts are opened in the protective layer 160 by etching it through a photo-resist mask, then stripped (not shown in the figure).

Figure 3J:
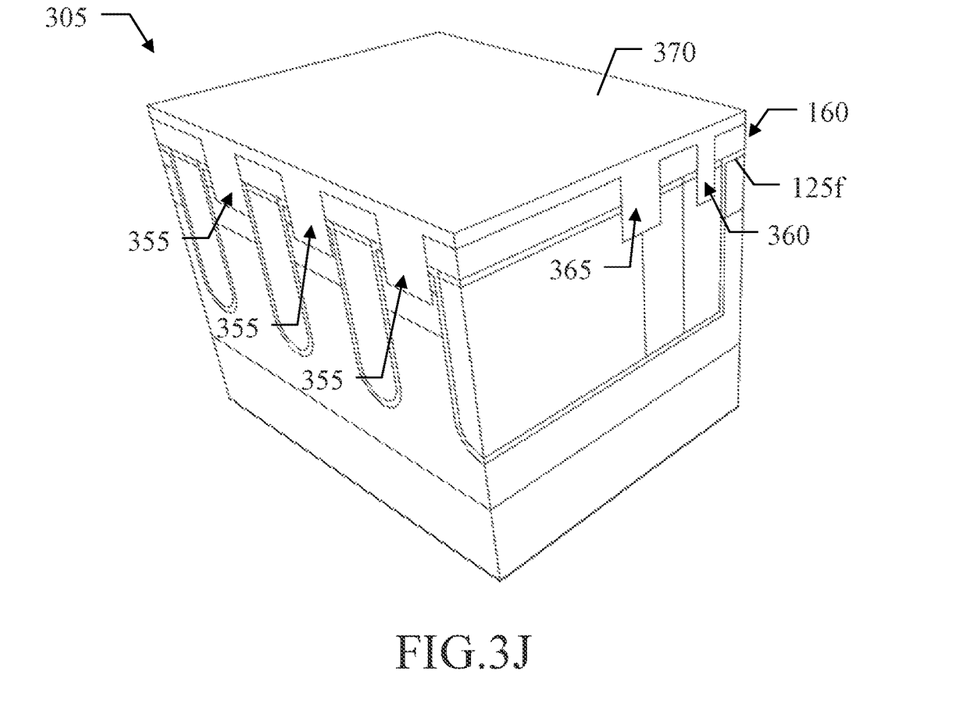

Moving to FIG. 3J, a layer of metal 370 (for example, Tungsten) is deposited onto the wafer 305, i.e., the protective layer 160, so as to fill the source windows 355, the gate windows 360 and the bridge windows 365, and to cover the (coated) front surface 125f.

Figure 3K:
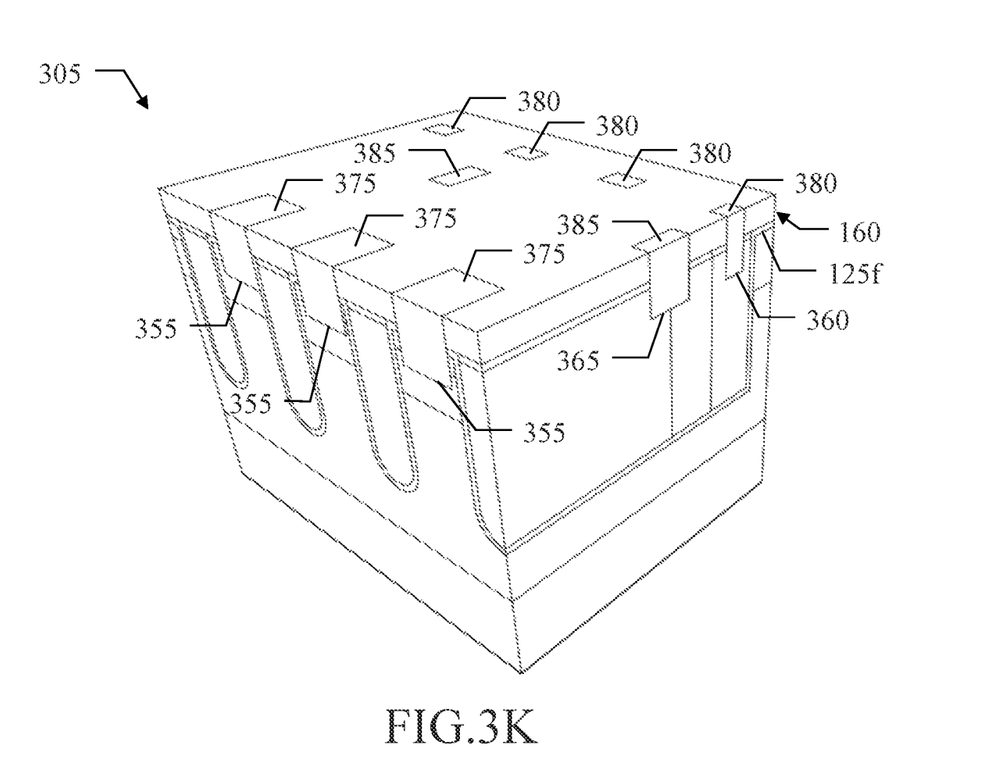

Moving to FIG. 3K, the wafer 305 is planarized (for example, with a CMP step) to remove an excess of the metal from the protective layer 160 on the front surface 125f. The operation leaves corresponding source plugs 375 in the source windows 355, gate plugs 380 in the gate windows 360 and bridge plugs 385 in the bridge windows 365. At this point, not shown in the figure, a layer of metal (for example, Copper) is deposited onto the wafer 305, i.e., the protective layer 160, the source plugs 375, the gate plugs 380 and the bridge plugs 385. The layer of metal is etched through a photo-resist mask, then stripped, so as to define a bar and corresponding strips in contact with the source plugs 375 (forming the source contact), a bar and corresponding strips in contact with the gate plugs 380 (forming the gate contact), and corresponding pads in contact with the bridge plugs 385 (forming the bridge contacts), thereby obtaining the structure shown in FIG. 1.

The above-described implementation allows obtaining the desired result with a limited number of additional process steps (and then with limited added costs).

Figure 4:
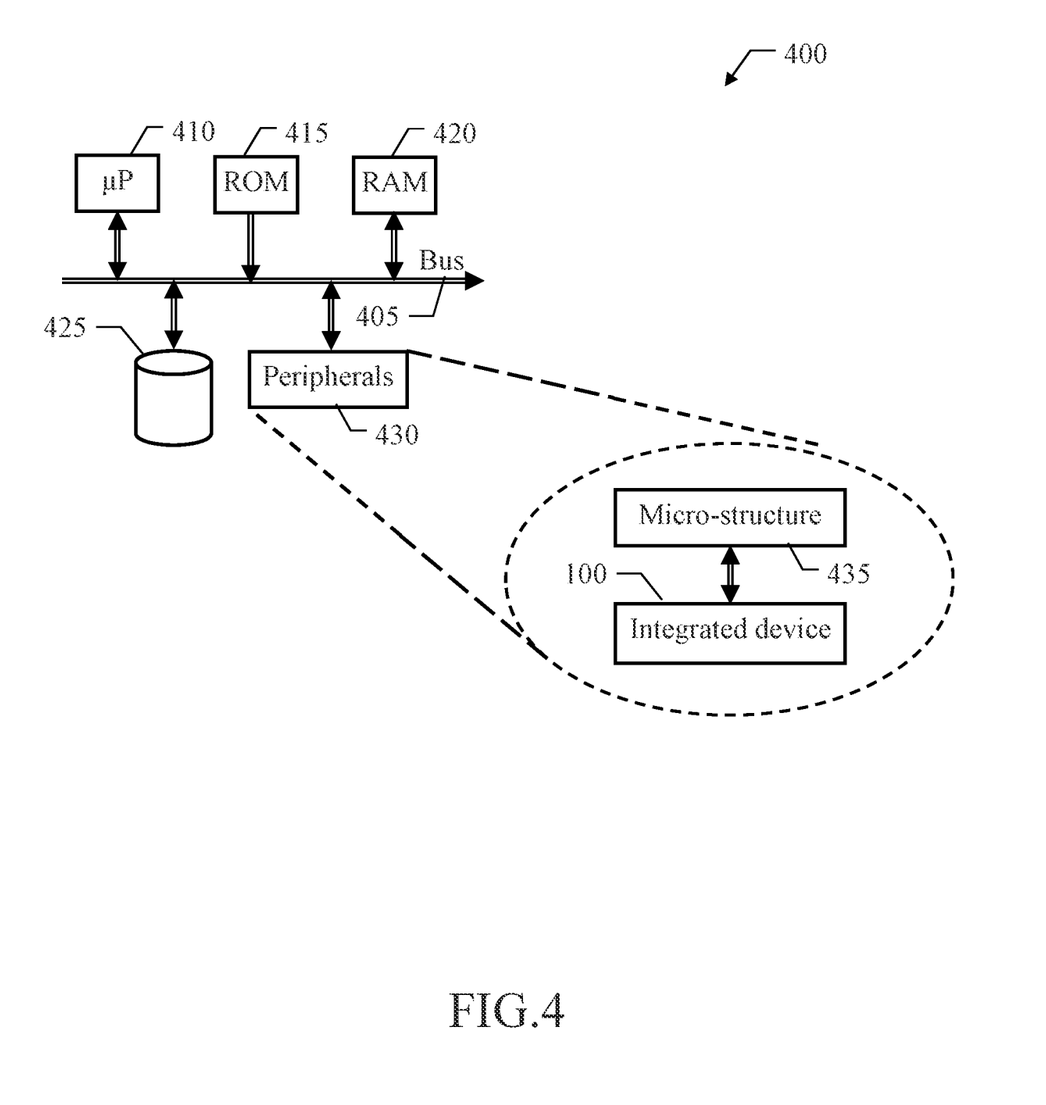

With reference now to FIG. 4, a schematic block diagram is shown of a system 400 incorporating the integrated device according to an embodiment of the present disclosure.

The system 400 (for example, a control unit for automotive applications) comprises several components that are connected among them through a bus structure 405 (with one or more levels). Particularly, one or more microprocessors (μP) 410 provide a logic capability of the system 400; a non-volatile memory (ROM) 415 stores basic code for a bootstrap of the system 400 and a volatile memory (RAM) 420 is used as a working memory by the microprocessors 410. The system has a mass-memory 425 for storing programs and data (for example, a flash EEPROM). Moreover, the system 400 comprises a number of controllers of peripheral, or Input/Output (I/O), units, 430 (such as a Wi-Fi WNIC, a Bluetooth transceiver, a GPS receiver, an accelerometer, a gyroscope and so on). Particularly, one or more of the peripherals 430 each comprises a micro (electro-mechanical) structure 435 (for example, one or more sensors/actuators) and the integrated device 100 for controlling the microstructure 435.

Modifications

Naturally, in order to satisfy local and specific requirements or design considerations, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. Moreover, items presented in a same group and different embodiments, examples or alternatives are not to be construed as de facto equivalent to each other (but they are separate and autonomous entities). In any case, each numerical value should be read as modified according to applicable tolerances; particularly, unless otherwise indicated, the terms "substantially," "about," "approximately" and the like should be understood as within 10%, preferably 5% and still more preferably 1%. Moreover, each range of numerical values should be intended as expressly specifying any possible number along the continuum within the range (comprising its end points). Ordinal or other qualifiers are merely used as labels to distinguish elements with the same name but do not by themselves connote any priority, precedence or order. The terms include, comprise, have, contain, involve and the like should be intended with an open, non-exhaustive meaning (i.e., not limited to the recited items), the terms based on, dependent on, according to, function of and the like should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

For example, an embodiment provides an integrated device. However, the integrated device may be of any type (for example, in raw wafer form, as a bare die, in a package, and so on).

In an embodiment, the integrated device comprises at least one MOS transistor. However, the integrated device may comprise any number and type of MOS transistors (for example, NMOS, PMOS, of power type, signal type, mixed type, operating at any current/voltage and so on).

In an embodiment, the MOS transistor is integrated on a die of semiconductor material. However, the die may be of any type (for example, an epitaxial layer grown on a substrate, a monocrystalline substrate, a SOI and so on) and of any semiconductor material (for example, silicon, germanium, with any type and concentration of dopants, and so on).

In an embodiment, the MOS transistor comprises a plurality of cells. However, the cells may be in any number and of any type (for example, strips, blocks, interdigitated, in an array and so on).

In an embodiment, each cell comprises a source region of semiconductor material. However, the source region may be of any shape, size, depth and type (for example, N, P, with any type and concentration of dopants, and so on).

In an embodiment, each cell comprises a gate element of electrical conductive material. However, the gate element may be of any shape, size and type (for example, buried with any depth, superficial, of polysilicon, metal and so on).

In an embodiment, each cell comprises a gate insulating layer of electrically insulating material insulating the gate element from the semiconductor material of the die. However, the gate insulating layer may be of any thickness, extent and type (for example, a single layer extending throughout all the gate elements, separate portions for each gate elements or group thereof, of silicon oxide, silicon nitride, TEOS and so on).

In an embodiment, the MOS transistor comprises a source contact coupled with the source regions. However, the source contact may be of any type (for example, of metal, doped polysilicon and so on) and it may be coupled with the source regions in any way (for example, via corresponding buried plugs, superficially, coupled with the possible body region as well or not, and so on).

In an embodiment, the MOS transistor comprises a gate contact coupled with the gate elements. However, the gate contact may be of any type and it may be coupled with the gate elements in any way (either the same or different with respect to the source contact).

In an embodiment, one or more selected cells are differentiated among the cells. However, the selected cells may be in any number and arranged in any way (for example, alternated with the other unselected cells, one out of two or more unselected cells, distributed uniformly, more concentrated in some areas and so on).

In an embodiment, each selected cell comprises a disabling structure interposed between a coupled gate portion of the gate element coupled with the gate contact and an uncoupled gate portion of the gate element uncoupled from the gate contact. However, the disabling structure may be of any type (for example, two diodes in anti-series, a single diode, a transistor, an additional disabling contact coupled with the gate element and so on) and it may be arranged at any position between the coupled gate portion and the uncoupled gate portion (for example, in the middle, proximal to the gate contact, proximal to the source region and so on).

In an embodiment, the disabling structure has an intervention voltage higher than a threshold voltage of the MOS transistor. However, then intervention voltage and the threshold voltage may have any value (either in absolute terms or relative to each other); moreover, the intervention voltage may be defined in any way (for example, by a reverse breakdown voltage, a threshold voltage, an external biasing voltage and so on).

In an embodiment, the disabling structure is configured to be in a non-conductive condition when the MOS transistor is switched on in response to a control voltage (applied between the gate contact and the source contact) comprised between the threshold voltage and the intervention voltage, or to be in a conductive condition otherwise. However, this result may be achieved in several ways (for example, with a diode/transistor that is conductive only when forward biased or reverse biased in electrical breakdown in response to the control voltage lower than the threshold voltage or higher than the intervention voltage, respectively, or vice-versa, with the control voltage that reaches the uncoupled gate portion only when it overcomes the biasing voltage applied to the disabling contact, and so on).

Further embodiments provide additional advantageous features, which may however be omitted at all in a basic implementation.

Particularly, in an embodiment in each of the selected cells the disabling structure comprises a diode having a reverse breakdown voltage defining the intervention voltage. However, the diode may be of any type (for example, an avalanche diode, a Zener diode and so on).

In an embodiment, the diode is configured to be reverse biased when the MOS transistor is switched on and to be forward biased when the MOS transistor is switched off. However, the opposite behavior (i.e., diode forward biased when the MOS transistor is switched on, conductive or not according to the control voltage, and reverse biased when the MOS transistor is switched off) is not excluded.

In an embodiment, the die is of a first type of conductivity and has a main surface. However, the first type of conductivity may be of any type (for example, N, P, with any type and concentration of dopands, and so on).

In an embodiment, the MOS transistor comprises at least one body region of a second type of conductivity extending from the main surface into the die. However, the second type of conductivity may be of any type (for example, P, N, with any type and concentration of dopands, and so on); moreover, the body regions may be in any number, of any shape, size, depth and type (for example, one for all the cells, one for each cell or groups thereof, and so on).

In an embodiment, each of the cells comprises the source region of the first type of conductivity extending from the main surface into the body region. However, the source region may extend into the body region in any way (for example, at any position, to any depth with respect thereto and so on).

In an embodiment, each of the cells comprises a gate trench extending from the main surface into the body region and the semiconductor material of the die. However, the gate trench may be of any shape, size and depth (for example, with a U section in a UMOS, a V section in a VMOS and so on).

In an embodiment, each of the cells comprises the gate insulating layer coating the gate trench. However, the gate insulating layer may coat the gate trench in any way (for example, only extending in the gate trench, further extending over the front surface and so on).

In an embodiment, each of the cells comprises the gate element filling the gate trench being coated with the gate insulating layer. However, the possibility is not excluded of having the MOS transistor with a planar structure.

In an embodiment, the die has a further main surface opposite the main surface; the MOS transistor comprises a drain region of the first type of conductivity extending from the further main surface into the die. However, the possibility is not excluded of having the MOS transistor with a lateral structure.

In an embodiment, in each of the selected cells the gate element comprises the coupled gate portion of semiconductor material of a gate type of conductivity (consisting of one of the first type of conductivity or the second type of conductivity). However, the coupled gate portion may be of any type (for example, P, N, with any type and concentration of dopands, and so on).

In an embodiment, in each of the selected cells the gate element comprises the uncoupled gate portion of semiconductor material of the gate type of conductivity. However, the uncoupled gate portion may be of any type (for example, with or without the same type and concentration of dopands with respect to the coupled gate portion).

In an embodiment, in each of the selected cells the disabling structure comprises a separation region of semiconductor material of a separation type of conductivity (opposite the gate type of conductivity) separating the coupled gate portion from the uncoupled gate portion. However, the separation region may be of any shape, size, depth and type (for example, N, P, with any type and concentration of dopands, and so on).

In an embodiment, the separation region and the coupled gate portion define the diode and the separation region and the uncoupled gate portion define a further diode connected in anti-series with the diode. However, the further diode may be of any type (either the same or different with respect to the diode) and the two diodes may be connected in anti-series in any way (for example, sharing their anodes or their cathodes).

In an embodiment, in each of the selected cells the disabling structure comprises a bridge element of electrically conductive material connected between the separation region and the uncoupled gate portion, the bridge element short-circuiting the further diode. However, the bridge element may be of any shape, size, depth and type (for example, of metal, doped polysilicon, at any position and so on).

In an embodiment, in each of the selected cells the coupled gate portion, the uncoupled gate portion and the separation region fill corresponding portions of the gate trench extending from the main surface to the gate insulating layer. However, the possibility is not excluded of having a different arrangement (for example, with the coupled/uncoupled gate portions extending to a lower depth and then a bottom of the gate trench filled by the separation region).

In an embodiment, in each of the selected cells the bridge element comprises a bridge trench extending from the main surface into the separation region and the uncoupled gate portion. However, the bridge trench may be of any shape, size and depth.

In an embodiment, in each of the selected cells the bridge element comprises a bridge plug of electrically conductive material filling the bridge trench. However, the possibility is not excluded of contacting the separation region and the uncoupled gate portion in a different way (for example, only on the front surface of the die and so on).

An embodiment provides a system comprising at least one integrated device as above. However, the same structure may be integrated with other circuits in the same chip; the chip may also be coupled with one or more other chips, it may be mounted in intermediate products or it may be used in complex apparatus. In any case, the resulting system may be of any type (for example, for use in automotive applications, smartphones, computers and so on) and it may comprise any number of these integrated devices.

Generally, similar considerations apply if the integrated device and the system each one has a different structure or comprises equivalent components (for example, of different materials) or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

An embodiment provides a process for manufacturing the above-mentioned integrated device. However, the integrated device may be manufactured with any technologies, with masks being different in number and in type, or with other process steps/parameters. Moreover, the above-described solution may be part of the design of an integrated device. The design may also be created in a hardware description language; moreover, if the designer does not manufacture chips or masks, the design may be transmitted by physical means to others.

Generally, similar considerations apply if the same solution is implemented with an equivalent method (by using similar steps with the same functions of more steps or portions thereof, removing some non-essential steps or adding further optional steps); moreover, the steps may be performed in a different order, concurrently or in an interleaved way (at least in part).

An integrated device (100) comprising at least one MOS transistor (105) integrated on a die (110) of semiconductor material, wherein the MOS transistor (105) may be summarized as including:
  a plurality of cells (135,150) each comprising:
    a source region (135) of semiconductor material,
    a gate element (150) of electrical conductive material, and
    a gate insulating layer (145) of electrically insulating material insulating the gate element (150) from the semiconductor material of the die (110),
  a source contact (165) coupled with the source regions (135),
  a gate contact (170) coupled with the gate elements (150), wherein one or more selected cells of the cells (135,150) each comprises:
    a disabling structure (175,180) interposed between a coupled gate portion (150c) of the gate element (150) coupled with the gate contact (170) and an uncoupled gate portion (150u) of the gate element (150) uncoupled from the gate contact (170), the disabling structure (175,180) having an intervention voltage higher than a threshold voltage of the MOS transistor (105) and being configured:
      to be in a non-conductive condition when the MOS transistor (105) is switched on in response to a control voltage applied between the gate contact (165) and the source contact (170) comprised between the threshold voltage and the intervention voltage, or
      to be in a conductive condition otherwise.

Each of the selected cells (135,150) the disabling structure (175,180) may include a diode ($Dp_1,Dp_3$) having a reverse breakdown voltage defining the intervention voltage, the diode ($Dp_1,Dp_3$) being configured to be reverse biased when the MOS transistor (105) is switched on and to be forward biased when the MOS transistor (105) is switched off.

The die (110) may be of a first type of conductivity and may have a main surface (125f), wherein the MOS transistor (105) may include:
  at least one body region (130) of a second type of conductivity extending from the main surface (125f) into the die (110),
  each of the cells (135,150) including:
    the source region (135) of the first type of conductivity extending from the main surface (125f) into the body region (130),
    a gate trench (140) extending from the main surface (125f) into the body region (130) and the semiconductor material of the die (110),
    the gate insulating layer (145) coating the gate trench (140), and
    the gate element (150) filling the gate trench (140) being coated with the gate insulating layer (145).

The die (110) may have a further main surface (125b) opposite the main surface (125f), wherein the MOS transistor (105) may include:
  a drain region (115) of the first type of conductivity extending from the further main surface (125b) into the die (110).

In each of the selected cells (135,150) the gate element (150) may include:
  the coupled gate portion (150c) of semiconductor material of a gate type of conductivity, consisting of one of the first type of conductivity or the second type of conductivity,
  the uncoupled gate portion (150u) of semiconductor material of the gate type of conductivity,
  and the disabling structure (175,180) may include:
    a separation region (175) of semiconductor material of a separation type of conductivity opposite the gate type of conductivity separating the coupled gate portion (150c) from the uncoupled gate portion (150u), the separation region (175) and the coupled gate portion (150c) defining the diode ($Dp_1,Dp_3$) and the separation region (175) and the uncoupled gate portion (150u) defining a further diode ($Dd_1,Dd_3$) connected in anti-series with the diode ($Dp_1,Dp_3$), and
    a bridge element (180) of electrically conductive material connected between the separation region (175) and the uncoupled gate portion (150u), the bridge element (180) short-circuiting the further diode ($Dd_1,Dd_3$).

In each of the selected cells (135,150) the coupled gate portion (150c), the uncoupled gate portion (150u) and the separation region (175) may fill corresponding portions of the gate trench (140) extending from the main surface (125f) to the gate insulating layer (145).

In each of the selected cells (135,150) the bridge element (180) may include:
  a bridge trench (365) extending from the main surface (125f) into the separation region (170) and the uncoupled gate portion (150u), and
  a bridge plug (385) of electrically conductive material filling the bridge trench (365).

A system (400) may be summarized as including at least one integrated device (100) according to any claim from 1 to 7.

A process for manufacturing an integrated device (100) may be summarized as including at least one MOS transistor (105) integrated on a die (110) of semiconductor material, wherein the process may include:
  forming a plurality of cells (135,150), for each of the cells (135,150) the process comprising:
    forming a source region (135) of semiconductor material,
    forming a gate element (150) of electrical conductive material, and
    forming a gate insulating layer (145) of electrically insulating material insulating the gate element (150) from the semiconductor material of the die (110),
  forming a source contact (165) coupled with the source regions (135),
  forming a gate contact (170) coupled with the gate elements (150),
  wherein for each of one or more selected cells of the cells (135,150) the process may include:
    forming a disabling structure (175,180) interposed between a coupled gate portion (150c) of the gate element (150) coupled with the gate contact (170) and an uncoupled gate portion (150u) of the gate element (150) uncoupled from the gate contact (170), the disabling structure (175,180) having an intervention voltage higher than a threshold voltage of the MOS transistor (105) and being configured to be in a non-conductive condition when the MOS transistor (105) is switched on in response to a control voltage applied between the gate contact (165) and the source contact (170) comprised between the threshold voltage and the intervention voltage, or to be in a conductive condition otherwise.

The die (110) may be of a first type of conductivity and has a main surface (125f), wherein the process may include:

forming a body region (130) of a second type of conductivity extending from the main surface (125f) into the die (110), for each of the cells (135,150) the process may include:

forming the source region (135) of the first type of conductivity extending from the main surface (125f) into the body region (130), forming a gate trench (140) extending from the main surface (125f) into the body region (130) and the semiconductor material of the die (110), forming the gate insulating layer (145) coating the gate trench (140), and forming the gate element (150) filling the gate trench (140) being coated with the gate insulating layer (145).

For the gate element (150) of each of the selected cells (135,150) the process may include:

forming the gate element (150) of semiconductor material of a gate type of conductivity, consisting of one of the first type of conductivity or the second type of conductivity, forming a separation trench (365) extending from the main surface (125f) into the gate region (150), the separation trench (365) separating the gate element (150) into the coupled gate portion (150c) and the uncoupled gate portion (150u), filling the separation trench (365) with a separation region (175) of a separation type of conductivity opposite the gate type of conductivity, the separation region (175) and the coupled gate portion (150c) defining a diode ($Dp_1, Dp_3$), having a reverse breakdown voltage defining the intervention voltage, and the separation region (175) and the uncoupled gate portion (150u) defining a further diode ($Dd_1, Dd_3$) connected in anti-series with the diode ($Dp_1, Dp_3$), and forming a bridge element (180) of electrically conductive material connected between the separation region (175) and the uncoupled gate portion (150u), the bridge element (180) short-circuiting the further diode ($Dd_1, Dd_3$).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated device, comprising:
   at least one MOS transistor integrated on a die of semiconductor material, the MOS transistor including:
   a plurality of cells, each of the cells including:
   a source region;
   a gate element of electrical conductive material; and
   a gate insulating layer of electrically insulating material insulating the gate element from the semiconductor material of the die;
   a source contact coupled with the source regions; and
   a gate contact coupled with the gate elements,
   wherein one or more selected cells of the plurality of cells includes:
   a disabling structure interposed between a coupled gate portion of the gate element coupled with the gate contact and an uncoupled gate portion of the gate element uncoupled from the gate contact, the disabling structure having an intervention voltage higher than a threshold voltage of the MOS transistor.

2. The integrated device according to claim 1, wherein the disabling structure is configured to:
   be in a non-conductive condition when the MOS transistor is switched on in response to a control voltage applied between the gate contact and the source contact, the control voltage being between the threshold voltage and the intervention voltage; or
   be in a conductive condition otherwise.

3. The integrated device according to claim 1, wherein in each of the selected cells the disabling structure includes a diode having a reverse breakdown voltage defining the intervention voltage, the diode being configured to be reverse biased when the MOS transistor is switched on and to be forward biased when the MOS transistor is switched off.

4. The integrated device according to claim 1, wherein the die has a first type of conductivity and has a main surface, the MOS transistor including:
   at least one body region having a second type of conductivity extending from the main surface into the die; and
   each of the cells includes:
   the source region having the first type of conductivity extending from the main surface into the body region;
   a gate trench extending from the main surface into the body region and the semiconductor material of the die;
   the gate insulating layer coating the gate trench; and
   the gate element filling the gate trench being coated with the gate insulating layer.

5. The integrated device according to claim 4, wherein the die has a further main surface opposite the main surface, the MOS transistor including:
   a drain region having the first type of conductivity extending from the further main surface into the die.

6. The integrated device according to claim 4, wherein in each of the selected cells the gate element includes:
   the coupled gate portion of semiconductor material of a gate type of conductivity, consisting of one of the first type of conductivity or the second type of conductivity;
   the uncoupled gate portion of semiconductor material of the gate type of conductivity; and
   the disabling structure includes:
   a separation region of semiconductor material of a separation type of conductivity opposite the gate type of conductivity separating the coupled gate portion from the uncoupled gate portion, the separation region and the coupled gate portion defining a diode and the separation region and the uncoupled gate portion defining a further diode connected in anti-series with the diode; and a bridge element of electrically conductive material connected between the separation region and the uncoupled gate portion, the bridge element short-circuiting the further diode.

7. The integrated device according to claim 6, wherein in each of the selected cells the coupled gate portion, the uncoupled gate portion and the separation region fill corresponding portions of the gate trench extending from the main surface to the gate insulating layer.

8. The integrated device according to claim 7, wherein in each of the selected cells the bridge element includes:
a bridge trench extending from the main surface into the separation region and the uncoupled gate portion; and
a bridge plug of electrically conductive material filling the bridge trench.

9. A system, comprising:
an integrated device, the integrated device including:
at least one MOS transistor integrated on a die of semiconductor material, the MOS transistor including:
a plurality of cells, each of the cells including:
a source region;
a gate element of electrical conductive material; and
a gate insulating layer of electrically insulating material insulating the gate element from the semiconductor material of the die;
a source contact coupled with the source regions; and
a gate contact coupled with the gate elements,
wherein one or more selected cells of the plurality of cells includes:
a disabling structure interposed between a coupled gate portion of the gate element coupled with the gate contact and an uncoupled gate portion of the gate element uncoupled from the gate contact, the disabling structure having an intervention voltage higher than a threshold voltage of the MOS transistor.

10. The system according to claim 9, wherein the disabling structure is configured to:
be in a non-conductive condition when the MOS transistor is switched on in response to a control voltage applied between the gate contact and the source contact, the control voltage being between the threshold voltage and the intervention voltage; or
be in a conductive condition otherwise.

11. The system according to claim 9, wherein in each of the selected cells the disabling structure includes a diode having a reverse breakdown voltage defining the intervention voltage, the diode being configured to be reverse biased when the MOS transistor is switched on and to be forward biased when the MOS transistor is switched off.

12. The system according to claim 9, wherein the die has a first type of conductivity and has a main surface, the MOS transistor including:
at least one body region having a second type of conductivity extending from the main surface into the die; and
each of the cells includes:
the source region having the first type of conductivity extending from the main surface into the body region;
a gate trench extending from the main surface into the body region and the semiconductor material of the die;
the gate insulating layer coating the gate trench; and
the gate element filling the gate trench being coated with the gate insulating layer.

13. The system according to claim 12, wherein the die has a further main surface opposite the main surface, the MOS transistor including:
a drain region having the first type of conductivity extending from the further main surface into the die.

14. The system according to claim 12, wherein in each of the selected cells the gate element includes:
the coupled gate portion of semiconductor material of a gate type of conductivity, consisting of one of the first type of conductivity or the second type of conductivity;
the uncoupled gate portion of semiconductor material of the gate type of conductivity; and
the disabling structure includes:
a separation region of semiconductor material of a separation type of conductivity opposite the gate type of conductivity separating the coupled gate portion from the uncoupled gate portion, the separation region and the coupled gate portion defining a diode and the separation region and the uncoupled gate portion defining a further diode connected in anti-series with the diode; and
a bridge element of electrically conductive material connected between the separation region and the uncoupled gate portion, the bridge element short-circuiting the further diode.

15. The system according to claim 14, wherein in each of the selected cells the coupled gate portion, the uncoupled gate portion and the separation region fill corresponding portions of the gate trench extending from the main surface to the gate insulating layer.

16. The system according to claim 15, wherein in each of the selected cells the bridge element includes:
a bridge trench extending from the main surface into the separation region and the uncoupled gate portion; and
a bridge plug of electrically conductive material filling the bridge trench.

17. A process for manufacturing an integrated device having at least one MOS transistor integrated on a die of semiconductor material, the process comprising:
forming a plurality of cells, for each of the cells the forming the plurality of cells including:
forming a source region;
forming a gate element of electrical conductive material; and
forming a gate insulating layer of electrically insulating material insulating the gate element from the semiconductor material of the die;
forming a source contact coupled with the source regions; and
forming a gate contact coupled with the gate elements,
wherein for each of one or more selected cells of the cells the process includes:
forming a disabling structure interposed between a coupled gate portion of the gate element coupled with the gate contact and an uncoupled gate portion of the gate element uncoupled from the gate contact, the disabling structure having an intervention voltage higher than a threshold voltage of the MOS transistor.

18. The process according to claim 17, wherein the disabling structure is configured to be in a non-conductive condition when the MOS transistor is switched on in response to a control voltage applied between the gate contact and the source contact, the control voltage being between the threshold voltage and the intervention voltage, or to be in a conductive condition otherwise.

19. The process according to claim 17, wherein the die has a first type of conductivity and has a main surface, the process further comprising:
- forming a body region having a second type of conductivity extending from the main surface into the die; and
- for each of the cells:
  - forming the source region having the first type of conductivity extending from the main surface into the body region;
  - forming a gate trench extending from the main surface into the body region and the semiconductor material of the die;
  - forming the gate insulating layer coating the gate trench; and
  - forming the gate element filling the gate trench being coated with the gate insulating layer.

20. The process according to claim 19, wherein for the gate element of each of the selected cells the process comprises:
- forming the gate element of semiconductor material of a gate type of conductivity, consisting of one of the first type of conductivity or the second type of conductivity;
- forming a separation trench extending from the main surface into a gate region, the separation trench separating the gate element into the coupled gate portion and the uncoupled gate portion;
- filling the separation trench with a separation region of a separation type of conductivity opposite the gate type of conductivity, the separation region and the coupled gate portion defining a diode, having a reverse breakdown voltage defining the intervention voltage, and the separation region and the uncoupled gate portion defining a further diode connected in anti-series with the diode; and
- forming a bridge element of electrically conductive material connected between the separation region and the uncoupled gate portion, the bridge element short-circuiting the further diode.

* * * * *